United States Patent [19]

Weinstock

[11] 4,042,880
[45] Aug. 16, 1977

[54] ELECTRODE ASSEMBLY FOR MEASURING THE EFFECTIVE THICKNESS OF THRU-HOLE PLATING CIRCUIT BOARD WORKPIECES

[75] Inventor: Jacques J. Weinstock, Flushing, N.Y.
[73] Assignee: Unit Process Assemblies, Inc., Syosset, N.Y.
[21] Appl. No.: 528,993
[22] Filed: Dec. 2, 1974

Related U.S. Application Data

[62] Division of Ser. No. 431,396, Jan. 7, 1974, Pat. No. 3,885,215.

[51] Int. Cl.$^2$ ............................................. G01R 27/14
[52] U.S. Cl. ................................... 324/64; 324/65 P; 324/158 P
[58] Field of Search ............... 324/64, 62, 65 P, 158 P

[56] References Cited

U.S. PATENT DOCUMENTS

| 902,753 | 11/1908 | Marshall | 324/65 P |
|---|---|---|---|
| 2,142,619 | 1/1939 | Sciaky | 324/64 |
| 2,437,697 | 3/1948 | Kalom | 324/65 P |
| 3,042,862 | 7/1962 | Edgar et al. | 324/64 |
| 3,192,474 | 6/1965 | Cherry | 324/64 X |
| 3,335,258 | 8/1967 | Barnhart et al. | 324/65 P |
| 3,676,776 | 7/1972 | Bauer et al. | 324/158 P X |
| 3,766,470 | 10/1973 | Hay et al. | 324/64 |

FOREIGN PATENT DOCUMENTS

| 922,225 | 3/1963 | United Kingdom | 324/65 P |

OTHER PUBLICATIONS

Gee et al., A Versatile Over-Under Four-Point Probe Apparatus, J. Phys. E. (GB), Jan. 1971, pp. 70-72.
Murcko, Split-Tip For Terminal Resistance Measurements, IBM Technical Disclosure Bulletin, July 1971, p. 479.

Primary Examiner—Stanley T. Krawczewicz
Attorney, Agent, or Firm—Robert E. Isner

[57] ABSTRACT

An improved electrode construction for apparatus for testing the integrity of thru-hole plating in printed circuit boards and the like by measuring the effective thickness thereof. A first conically shaped electrode assembly is adapted to be displaced along a predetermined path into engagement with one of the defining marginal perimetric edges of a plated thru-hole in a circuit board. A second and complementally shaped electrode assembly is adapted to be displaced into engagement with the other defining marginal perimetric edge of the thru-hole. Each of such electrode assemblies includes a pair of discrete selectively contoured electrode elements adapted to make line contact with the marginal defining edges of the thru-hole, whereby a predetermined magnitude of constant current can be passed through the plating intermediate one pair of electrode elements, and the voltage drop developed thereby across the thru-hole plating measured by the other pair of electrode elements.

1 Claim, 3 Drawing Figures

ELECTRODE ASSEMBLY FOR MEASURING THE EFFECTIVE THICKNESS OF THRU-HOLE PLATING CIRCUIT BOARD WORKPIECES

This application is a division of my application Ser. No. 431,396, filed Jan. 7, 1974, now U.S. Pat. No. 3,885,215.

This invention relates to instruments for measuring the conductivity or thickness of thin layers or coatings of electrically conductive materials within apertures or the like, and particularly to instruments for measuring the plating thickness or conductivity of electrically conductive materials on the side walls of thru-holes in printed circuit boards.

Beta ray backscatter measuring instruments have been extensively utilized to measure the thickness of metallic deposits and coatings of various materials. These instruments generally include a source of beta radiation, a detector, such as a Geiger-Muller tube for measuring the radiation backscattered from the coating and an associated electronic counter or readout unit that converts the output of the detector into utilizable intelligence. Such beta ray backscatter measuring instruments cannot be effectively used for measuring the thickness of the plating in thru-holes in printed circuit boards where one base plating has an over plating of gold or solder and they are generally unable to detect cracks, voids, or other defects in the plated coating. More recently, thru-hole plating integrity and thickness have been ascertained by use of two pairs of selectively positioned single point contacts and the measurement of the voltage drop across the plating induced by the passage of a constant current therethrough. Systems of this type are disclosed in U.S. Pat. No. 3,766,470 of Oct. 16, 1973. Experience to date has indicated however that such systems present critical problems of probe geometry and additional difficulties in interpretation of results as occasioned by localized variations of the electrical currents within the coatings being measured.

The present invention may be briefly described as an improved electrode assembly utilizable in apparatus for non-destructive measurement of the physical integrity and thickness of plated coatings on thru-holes in printed circuit boards and the like by micro-resistance measurement techniques. In its broader aspects, the invention includes a pair of selectively constituted and complementally contoured electrode assemblies displaceable into engagement with the upper and lower defining marginal perimetric edges of a plated thru-hole in a circuit board workpiece. Each of said electrode assemblies is compositely constituted of a first generally conically shaped electrode contact element of circumferential extent sufficient to engage the principal portion of the defining marginal perimetric edge of a plated thru-hole in essentially line contact therewith and a discrete and relatively small second electrode contact element that is electrically isolated from said first electrode contact element and has an exposed circumferential extent sufficient to engage substantially all of the remaining portion of the defining marginal perimetric edge of the plated thru-hole. In the operation thereof, and subsequent to the engagement of the electrode assemblies with the upper and lower defining marginal perimetric edges of a thru-hole in the manner indicated above, a predetermined and constant amount of current is passed through the first conically shaped electrode contact element of one of said assemblies, the plating on the thru-hole and the first conically shaped electrode contact element of the second of said assemblies, and the voltage drop developed as a result of the passage of such current across the thru-hole plating is measured by the pair of discrete second electrode contact elements.

Among the advantages of the present invention is the provision of an improved electrode assembly for apparatus for measuring the thickness of thru-hole plating in printed circuit boards as well as providing an indication of the physical and electrical integrity thereof. Another advantage of the present invention is the minimization, if not effective avoidance, of difficulties in interpreting results occasioned by localized variations in the current in the coatings being measured that has heretofore characterized multi-electrode microresistance measurement techniques.

Accordingly, the principle object of the present invention is the provision of an improved electrode assembly for apparatus for non-destructively measuring the thickness of thru-hole plating in printed circuit boards.

Another object of the present invention is the provision of an improved electrode assembly for multi-electrode microresistance measuring apparatus that is essentially free of difficulties in result interpretation occasioned by localized variations in the current in the coating being measured.

A further object of the present invention is the provision of an improved electrode assembly that facilitates the detection of cracks, voids, the presence of bath contaminants and other defects in printed circuit board thru-hole platings.

Other objects and advantages of the subject invention will become apparent from the following portion of the specification and from the accompanying drawings which illustrate, in accord with the mandate of the patent statutes, presently preferred embodiments incorporating the principles of the present invention.

Referring to the drawings.

Figure 1:
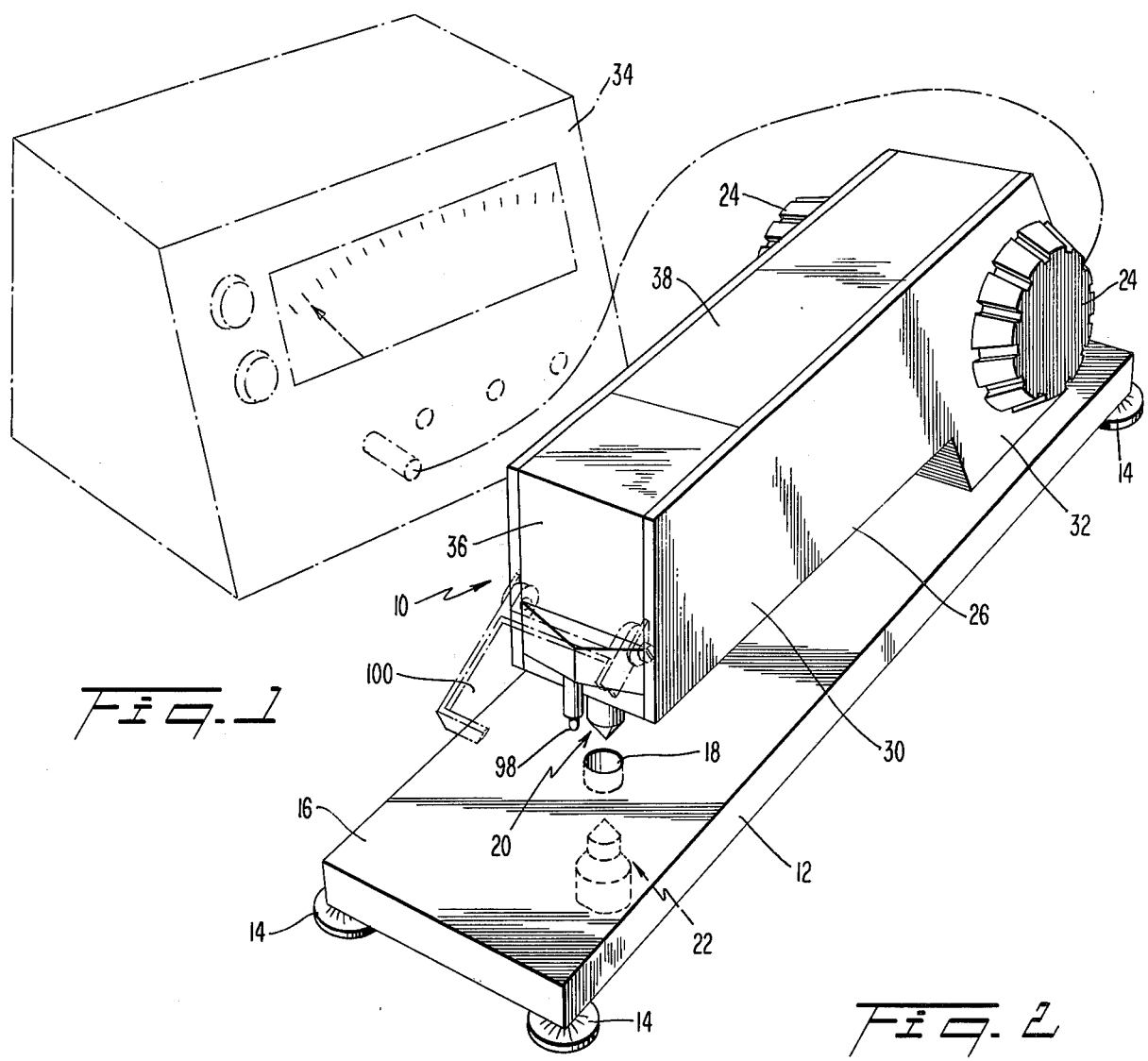
FIG. 1 is an oblique schematic view of measurement apparatus that may incorporate the present invention.

Referring to the drawings and initially to FIG. 1, there is provided an apparatus, generally designated 10, for measuring the effective thickness and for sensing defects in the plated coatings of plated thru-holes in printed circuit boards and is of the mechanical type generally disclosed in U.S. Pat. No. 3,766,470. Reference should be had to this patent for suitable constructional detail for electrode displacing mechanisms and the like. As there shown, the measurement apparatus 10 includes an elongate rectangular base member 12 supported on corner pedestals 14 which provides a horizontal workpiece supporting surface 16. A circular aperture 18 in the base member 12 defines an operating location in the path of vertical displacement of the hereinafter described electrode assemblies. A printed circuit board (not here shown) is readily positionable on the surface 16 and is adapted to be supported thereby with the axis of the thru-hole to be measured disposed in generally vertically coaligned relation with the axis of the aperture 18 at the operating location. An upper electrode assembly, generally designated 20, is vertically displaceable in the elongated housing 26 along the longitudinal axis of the aperture 18 and a lower electrode assembly 22 of complemental character is disposed in longitudinal coalignment therewith and is vertically displaceable within the aperture 20 in the base member 12. When the electrode displacement control knobs 24 are rotated, the electrode assemblies are vertically displaced, preferably in sequential relation and are thereby brought into engagement with the upper and lower surfaces of the thru-hole plating, in the manner hereinafter described. The workpiece is accordingly pinched under essentially uniform and reproducable pressures between the opposing pair of electrode assemblies thus assuring excellent contact between the electrode assemblies and the upper and lower defining marginal perimetric edges of the thru-hole plating being tested.

The elongated housing 26 is mounted to the back of the base 12, as at 32, and extends along the base in a cantilevered raised relation therewith to define a work space therebetween open at the sides and front. The housing includes laterally spaced side walls 30 and removable cover plates 36, 38 which enclose the top and front and portions of the housing.

The illustrated housing assembly is electrically connected to a readout unit or meter 34 which operatively supplies current to the apparatus which passes through the electrode assemblies in the manner described in the above mentioned U.S. patent. The voltage drop across the thru-hole plating developed as a result of the passage of such current therethrough is measured and converted by the readout unit into utilizable intelligence.

Figure 2:
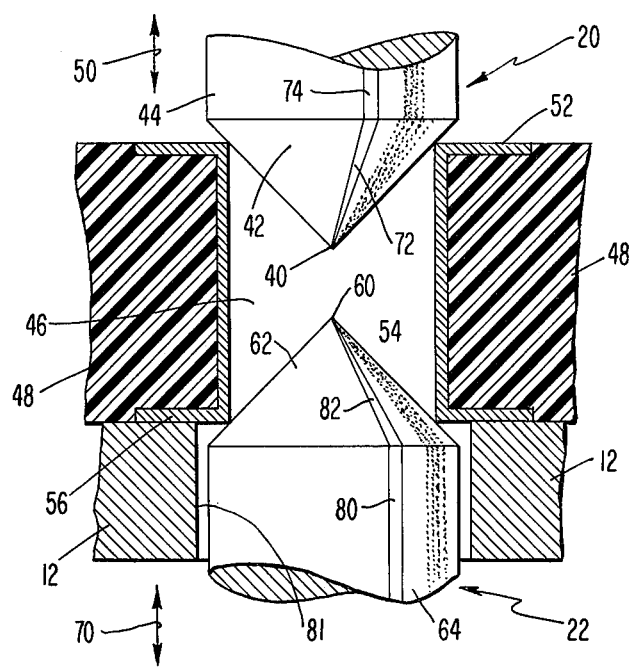
FIG. 2 is an enlarged and simplified schematic view, partially in section, of an improved electrode assembly constructed in accord with the principles of this invention and as disposed in operative engagement with a plated thru-hole in a printed circuit board.

As best shown in FIG. 2, the essentials of the improved electrode system constructed in accord with the principles of this invention, include a first electrode assembly, generally designated 20, and a complementally shaped second electrode assembly, generally designated 22, disposed in longitudinal coaxial relation therewith. The first electrode assembly 20 is contoured to provide a conically shaped terminal contact portion 42 disposed at the end of a cylindrical barrel portion 44. The barrel portion 44 is sized to be of greater diameter than that of the thru-holes in printed circuit board workpieces to be measured so as to assure a selectively limited degree of penetration of the conically shaped terminal contact portions 42 therewithin. The first electrode assembly 20 is vertically displaceable, as schematically illustrated by the arrows 50, into and out of engagement with an interposed printed circuit board workpiece 48 supported on the base member 12. When disposed in operative engagement therewith, as illustrated in the drawings, the apex 40 and a predetermined portion of the conically shaped terminal contact portion 42, dependent upon the relative diameters involved, will enter the thru-hole 46 and, in addition to performing an automatic alignment thereof, will effect an essentially circumferential line contact therewith at the upper defining marginal perimetric edge 52 of the plated coating 54 therein.

Disposed in longitudinal coaxial alignment with the above described first electrode assembly 20 is a complementally sized and constructed second electrode assembly, generally designated 22. The second electrode assembly 22 includes a conically shaped terminal contact portion 62 disposed at the end of a cylindrical barrel portion 64. The barrel portion 64 is sized to be of greater diameter than that of the thru-holes in the printed circuit board workpieces to be measured so as to assure a selectively limited degree of penetration of the conically shaped terminal contact portion 62 therein. The second electrode assembly 22 is vertically displaceable, as schematically illustrated by the arrows 70, into and out of engagement with the interposed printed circuit board workpiece 48. When disposed in operative engagement therewith, as illustrated in the drawing, the apex 60 and a predetermined portion of the conically shaped terminal contact portion 62, dependent upon the relative diameters involved, will enter the thru-hole 46 and, in addition to cooperating in effecting an automatic alignment thereof, will effect an essentially circumferential line contact therewith at the lower defining marginal perimetric edge 56 of the plated coating 54 therein.

The described first electrode assembly 20 is effectively subdivided into a pair of discrete electrode elements by inclusion of a separate and discrete electrode segment 72 in the form of a relatively narrow wedge shaped sector having its exposed surface 74 disposed in coplanar relation with the remainder of the conical surface forming the terminal end contact portion 42. The segment or sector electrode element 72 preferably extends from the apex 40 of the conical terminal contact portion 42 at least through the full length of the conical end contact portion 42 and is electrically isolated, as by interposition of insulating media, such as air gaps or insulating films, at the interfaces between such segment or sector electrode element 72 and the remainder of the electrode assembly as constituted by the remainder of the conically shaped terminal contact portion 42.

In a similar manner, the described second electrode assembly 22 is also effectively subdivided into a pair of discrete electrode elements by inclusion of a separate and discrete electrode segment 80 in the form of a relatively narrow wedge shaped sector having its exposed surface 82 disposed in coplanar relation with the remainder of the conical surface forming the terminal end contact portion 62 thereof. Here again, the segment or sector electrode element 82 extends from the apex 60 at least through the full length of the conical end contact portion 62 and is electrically isolated therefrom, as by the interposition of insulating media, such as air gaps or insulating films at the interfaces between such segment or sector electrode element 82 and the remainder of the electrode assembly as constituted by the remainder of the conically shaped terminal contact portion 62.

As will now be apparent, each of the electrode assemblies 20 and 22 includes two discrete electrode elements, the first being essentially in the form of a cone adapted to be disposed in circumferential line contact with the principal portion of the length of the defining marginal perimetric edge of the plated thru-hole and the second electrode element being of markedly limited circumferential extent and adapted to selectively engage, in essentially line contact, only the remaining portion of the defining perimetric edge of the plated hole. Such electrode configuration effectively results in a uniform feed of current around the principal portion of the circumference of the thru-hole and minimizes, if not effectively eliminates, localized current gradients within the plating. This not only permits an actual measurement of the resistance of the plating but also dispenses with the need and use of empirical calibration curves and the like.

Figure 3:
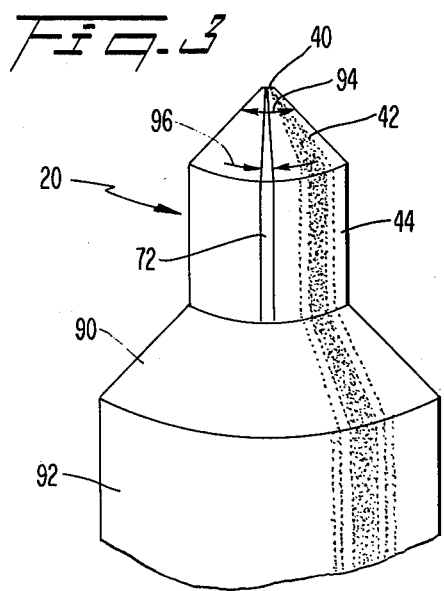
FIG. 3 is a further enlarged and simplified schematic view of one of the electrodes incorporated in an improved electrode assembly constructed in accord with the principles of this invention.

FIG. 3 is further illustrative of some of the detailed structure of a presently preferred embodiment of an electrode configuration, as for example, for one of electrode assemblies 20 or 22 as described above. Taking the first electrode assembly 20, for example, the cylindrical barrel portion 44 thereof desirably constitutes an extension of an intermediate truncated conical section 90 constituting an inclined shoulder or necked-down portion of a still larger diameter cylindrical barrel portion 92. Such type of construction provides not only increased strength and larger sized elements for engagement with the vertical displacing mechanism therefor, but also serves to provide for increased visibility of the terminal workpiece engaging portion of the electrode during operation of a unit.

In presently preferred and practical working embodiments incorporating the principles of the invention, the included angle 94 of the conically shaped terminal contact electrode portion 42 is desirably set at about 90°, although included angles of 60° up to about 120° can be employed depending upon the thru-hole diameter and the thickness of circuit board being measured. Likewise, the apex 40 may be rounded; bevelled or flattened as shown in FIG. 3. It is also presently preferred that the wedge shaped segment or sector electrode 72 be made as small as possible within practical limits. For example, a sector electrode 72 having an included angle 96 of 1° or less would be ideal; however, the mechanical problems of machining such a sector and providing the necessary insulation at the boundary interfaces thereof dictate the use of sector electrodes having an included angle 96 of about 30° as a practical expedient. Experience to date has indicated that as the sector electrode element gets larger, the magnitude of variation in result due to variations in localized current flow becomes larger and that such variations become detrimental in magnitude for sectors over about 60°-75° in extant.

It is also preferred to selectively locate the sector electrodes 72 and 82 remote from each other and desirably such are disposed in 180° apart relation in an operative assembly.

In the preferred mode of operation for electrode assembly units of the type described, the second electrode assembly 22 is desirably maintained in a retracted position beneath the aperture 18 in the base element 12 while the printed board workpiece is being positioned to locate the thru-hole to be measured at the operating station. Initial rotation of the electrode displacement knobs 24 desirably effects an initial and selective downward displacement of the upper electrode assembly 20 to cause the apex 40 at the dependent end thereof to enter the particular thru-hole to be measured and to effect the automatic alignment of the thru-hole relative to the conically shaped terminal contact portion 42 thereof. Following the seating of the terminal contact portion 42 of the first electrode assembly 20 in circumferential line contact with the upper defining marginal perimetric edge 52 of the plated coating 54, the lower or second electrode assembly 22 is then sequentially raised into similar operative circumferential engagement with the lower defining marginal perimetric edge 56 of the plating 54. Such sequenced mode of electrode assembly displacement operates to preclude scratching of the underside of the printed circuit board by the apex 60 of the lower electrode assembly 22 and possible damage to the latter resulting from such undesirable contact.

In order to facilitate presentation of the workpiece relative to the electrode assembly, a light 98 and a magnifying lens 100 pivotally secured to the testing apparatus are provided giving the operator an enlarged and illuminated view of the thru-hole being measured.

The nature of the associated electrical circuitry that is connected to the electrode elements forms no part of the subject invention. For illustrative reference thereto and to the nature of the mode of electrical operation involved, reference may be had to said U.S. Pat. No. 3,766,470.

Having thus described my invention, I claim:

1. In the measurement of the conductivity of a plated coating on a thru-hole of circular cross section in a circuit board workpiece the steps of
    uniformly feeding current through said plating through line electrode contact with over 80% of the circumference of the defining marginal perimetric edges of said thru-hole,
    and sensing the voltage drop across said plating effected thereby through line electrode contact with the remaining portion of the circumference of the defining marginal perimetric edges of said thru-hole.

* * * * *